(12) United States Patent
Fragano et al.

(10) Patent No.: US 7,609,569 B2
(45) Date of Patent: Oct. 27, 2009

(54) SYSTEM AND METHOD FOR IMPLEMENTING ROW REDUNDANCY WITH REDUCED ACCESS TIME AND REDUCED DEVICE AREA

(75) Inventors: Michael T. Fragano, Essex Junction, VT (US); Harold Pilo, Underhill, VT (US)

(73) Assignee: International Busines Machines Corporation, Armonk, NY (US)

( * ) Notice: Subject to any disclaimer, the term of this patent is extended or adjusted under 35 U.S.C. 154(b) by 4 days.

(21) Appl. No.: 11/941,994

(22) Filed: Nov. 19, 2007

(65) Prior Publication Data

US 2009/0129181 A1    May 21, 2009

(51) Int. Cl.
*G11C 7/00* (2006.01)
(52) U.S. Cl. ............. 365/200; 365/230.03; 365/230.06; 365/230.01
(58) Field of Classification Search ................. 365/200, 365/230.03, 230.06, 230.01
See application file for complete search history.

(56) References Cited

U.S. PATENT DOCUMENTS

| | | | |
|---|---|---|---|
| 5,526,307 A * | 6/1996 | Yiu et al. ............... | 365/185.01 |
| 5,621,690 A * | 4/1997 | Jungroth et al. ............. | 365/200 |
| 5,808,944 A * | 9/1998 | Yoshitake et al. ........... | 365/200 |
| 6,870,782 B2 | 3/2005 | Wu et al. | |
| 7,068,555 B2 * | 6/2006 | Sugimoto et al. ........... | 365/200 |
| 7,093,171 B2 | 8/2006 | Hsu et al. | |
| 7,102,941 B2 * | 9/2006 | Yaoi et al. .................... | 365/200 |
| 7,154,803 B2 * | 12/2006 | Martinelli et al. ........... | 365/227 |

* cited by examiner

*Primary Examiner*—Viet Q Nguyen
(74) *Attorney, Agent, or Firm*—Cantor Colburn LLP; Michael LeStrange

(57) ABSTRACT

A system for implementing row redundancy in integrated circuit memory devices includes one or more main subarrays having word line, bit line and memory cell devices, each of the one or more main subarrays including a set of support circuitry associated therewith. A discrete, redundant subarray is associated with the main subarrays, and also includes a set of support circuitry associated therewith. A common global bit line is shared by the main subarrays and the redundant subarray, and redundancy steering control circuitry is associated with the main subarrays and the redundant subarray. The redundancy steering control circuitry is configured such that word line activation of the main subarrays and the redundant subarray is performed in parallel with address compare operations performed by the redundancy steering control circuitry.

16 Claims, 4 Drawing Sheets

SYSTEM AND METHOD FOR IMPLEMENTING ROW REDUNDANCY WITH REDUCED ACCESS TIME AND REDUCED DEVICE AREA

BACKGROUND

The present invention relates generally to integrated circuit memory devices and, more particularly, to a system and method for implementing row redundancy with reduced access time and reduced device area.

Memory devices are commonly employed as internal storage areas in a computer or other type of electronic equipment. One specific type of memory used to store data in a computer is random access memory (RAM), such as static RAM (SRAM) or dynamic RAM (DRAM), for example. RAM is typically used as main memory in a computer environment. RAM is generally volatile, in that once power is turned off, all data stored in the RAM is lost.

As is the case with other types of integrated circuit devices, defects can occur during the manufacture of a memory array having rows and columns of individual memory cells. Typical defects can include, for example, bad memory cells, open circuits, shorts between a pair of rows and shorts between a row and column. In any case, defects can reduce the overall yield of the memory device manufacturing process. One way to address this problem, without discarding the memory device, is to incorporate redundant elements in the memory that selectively replace defective elements. For example, redundant rows are one type of redundant element that may be provided in memory to replace a defective primary row.

After a memory die has been manufactured, it is tested for defects. Generally with volatile memory, redundancy circuitry is used to selectively redirect access (address) requests from to the defective elements to the redundant elements. Redundancy circuitry may include, for example, electrical fuses that are selectively "blown" (open circuited) to electrically disconnect the defective rows. The redundant rows are then activated to replace the shorted rows. In addition, some memory devices may utilize non-volatile registers or fuse blocks to permanently store addresses of primary elements that are designated for replacement. The fuse blocks are typically coupled with redundancy control logic that compares address requests to addresses stored in the fuse blocks. If an address request matches an address stored in a fuse block, the redundant circuit directs or maps the access request to the redundant row instead of the defective row in the default or main array.

However, with respect to conventional approaches to row redundancy circuitry, there is typically a design tradeoff between the device real estate occupied by the circuitry and the access/setup time for implementing both the redundancy compare and memory access operations and/or repair efficiency of the redundant elements. Accordingly, it would be desirable to be able to implement a row redundancy scheme that reduces the impact on device area, and at the same time does not adversely affect access/address setup time or the repair efficiency of the elements.

SUMMARY

The foregoing discussed drawbacks and deficiencies of the prior art are overcome or alleviated by a system for implementing row redundancy in integrated circuit memory devices. In an exemplary embodiment, the system includes one or more main subarrays having word line, bit line and memory cell devices, each of the one or more main subarrays including a set of support circuitry associated therewith; a discrete, redundant subarray associated with the one or more main subarrays, the redundant subarray also including a set of support circuitry associated therewith; a common global bit line shared by the one or more main subarrays and the redundant subarray; and redundancy steering control circuitry associated with the one or more main subarrays and the redundant subarray, wherein the redundancy steering control circuitry is configured such that word line activation of the one or more main subarrays and the redundant subarray is performed in parallel with address compare operations performed by the redundancy steering control circuitry.

In another embodiment, a method of implementing row redundancy in integrated circuit memory devices includes activating, based upon a presented address, a word line within one or more main subarrays and a discrete, redundant subarray associated with the one or more main subarrays; the one or more main subarrays and the redundant subarray each having word line, bit line and memory cell devices, and a set of support circuitry associated therewith, wherein the one or more main subarrays and the redundant subarray share a common global bit line; and performing, in parallel with the word line activation, an address compare operation using redundancy steering control circuitry; wherein, depending upon the result of the address compare operation, data output on the common global bit line is from either the one or more main subarrays or the redundant subarray.

BRIEF DESCRIPTION OF THE DRAWINGS

Referring to the exemplary drawings wherein like elements are numbered alike in the several Figures.

DETAILED DESCRIPTION

Disclosed herein is a system and method for implementing row redundancy with low area overhead, low performance impact and low power impact. Briefly stated, a row redundancy system includes a discrete, redundant memory subarray (containing redundant-only wordlines) that is associated with the main memory subarrays. The redundant array is "integrated" with the other main (default) subarrays in the sense that a common global bit line bus is shared with the main array, thereby resulting in a seamless partition between a subarray in the main array and the redundant subarray. Since there are no separation gaps or logic dividing the main and redundant subarrays, all bussing structures, including data busses, can be shared between the two. As further described herein, the address compare logic does not contribute to word line activation time, but is instead coupled to the main/redundant array support circuitry so as to implement a "late" routing decision with respect to certain timing control signals associated with the subarray support circuitry.

Figure 1:
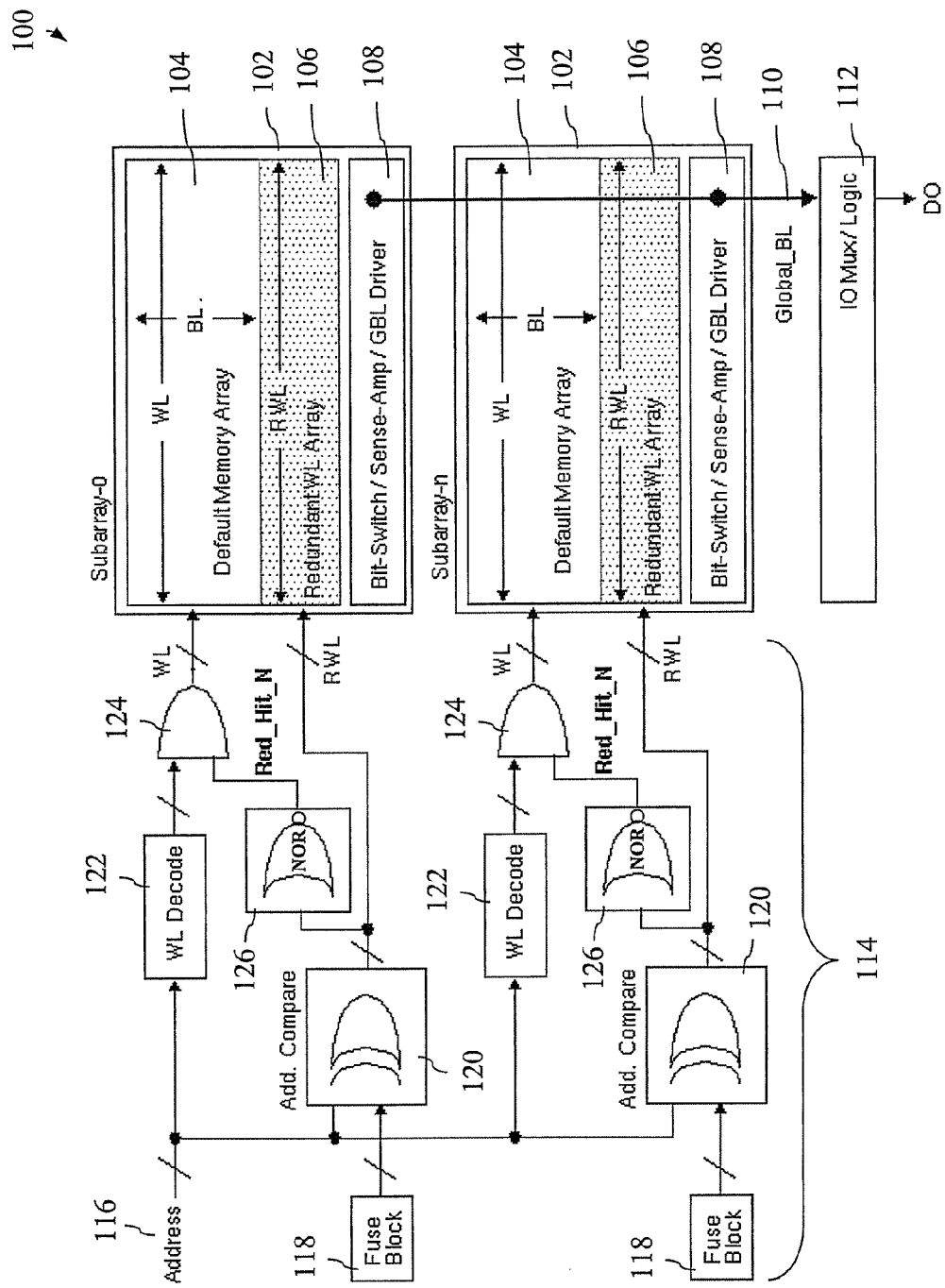
FIG. 1 is a schematic diagram of a conventional row redundancy system for memory devices.

Referring initially to FIG. 1, there is shown a schematic diagram of an existing row redundancy system 100 for memory devices. The system 100 may be applicable to various types of memory devices, such an SRAM array or a DRAM array, for example. The system 100 depicted in FIG. 1 may be characterized as an "integrated row redundancy" scheme, in that each memory subarray 102 (e.g., Subarray_0 . . . . Subarray_n), in addition to the main or "default" array 104 of word lines, bit lines and memory cells, is provided with its own individual redundant word line (WL) array 106. By way of example, if each subarray 102 has 128 word lines in the default array 104, then there may be a pair (2) of redundant word lines integrated within each subarray. A different number of redundant word lines may also be used, however.

As further depicted in FIG. 1, each subarray 102 also includes its own bit-switch/sense amplifier/global bit line driver circuitry 108 (also referred to herein as "support circuitry"). The support circuitry 108 for each subarray 102 is coupled to a common global bit line bus 110, which in turn feeds input/output multiplexing and control logic circuitry 112 so that the requested memory information can be output to a requesting client or device (not shown), such as a processor for example.

In order to implement the row redundancy scheme for the system 100 in FIG. 1, steering control circuitry 114 is used. A requested address 116 is compared with stored fuse data in block 118 to determine whether the row address corresponds to one that was identified as defective, for each of the memory subarrays 102. In the event that there is a match between the requested address 116 and any of the information stored in the fuse block 118, the control circuitry causes an appropriate redundant word line in the redundant array 106 to be activated instead of the defective word line in the associated default array 104.

More specifically, address compare logic 120 (e.g., exclusive OR (XOR) logic) determines whether the address bits match any of the bits stored in the associated fuse block 118 for each subarray 102. At the same time, the address bits are decoded by word line decode circuitry 122. However, it will also be seen that the decoded word line signals are gated by AND gates 124 before being allowed to pass through to (and hence activate) the word lines in the default arrays 104. In turn, the decoded word line signals are gated when the value of the gating signal Red_Hit_N (redundancy hit negative) is high. Stated another way, the results of the comparison of the address data with data in the fuse block are entirely negative. This may be implemented, for example, through the use of NOR logic blocks 126 configured to compare the results of each output of the address compare logic 120.

On the other hand, if there is an address match for one or more subarrays with respect to stored fuse block data, then the output of the associated NOR logic block 126 will be low, and the decoded word line signal will not be allowed to activate the defective word line in the associated subarray. Instead, the output of the address compare logic 120 will activate a redundant word line in the associated redundant word line array 104.

Regardless of whether the address comparison operation results in a redundancy "hit" or "miss", it will be seen from the system 100 of FIG. 1 that the word line activation (default array or redundant array) does not take place until the comparison is complete. In practical terms, this results in a speed penalty due to the propagation of signals through the address compare logic 114 prior to word line activation. Another disadvantage associated with the "integrated row redundancy" approach of FIG. 1 is that the repair efficiency of the redundant word lines, with respect to the size of the subarray is relative low. In other words, if a particular subarray has no defects, then the redundant word lines associated with that subarray will remain unused, since they are not configured to service any of the other subarrays in the memory device.

Figure 2:
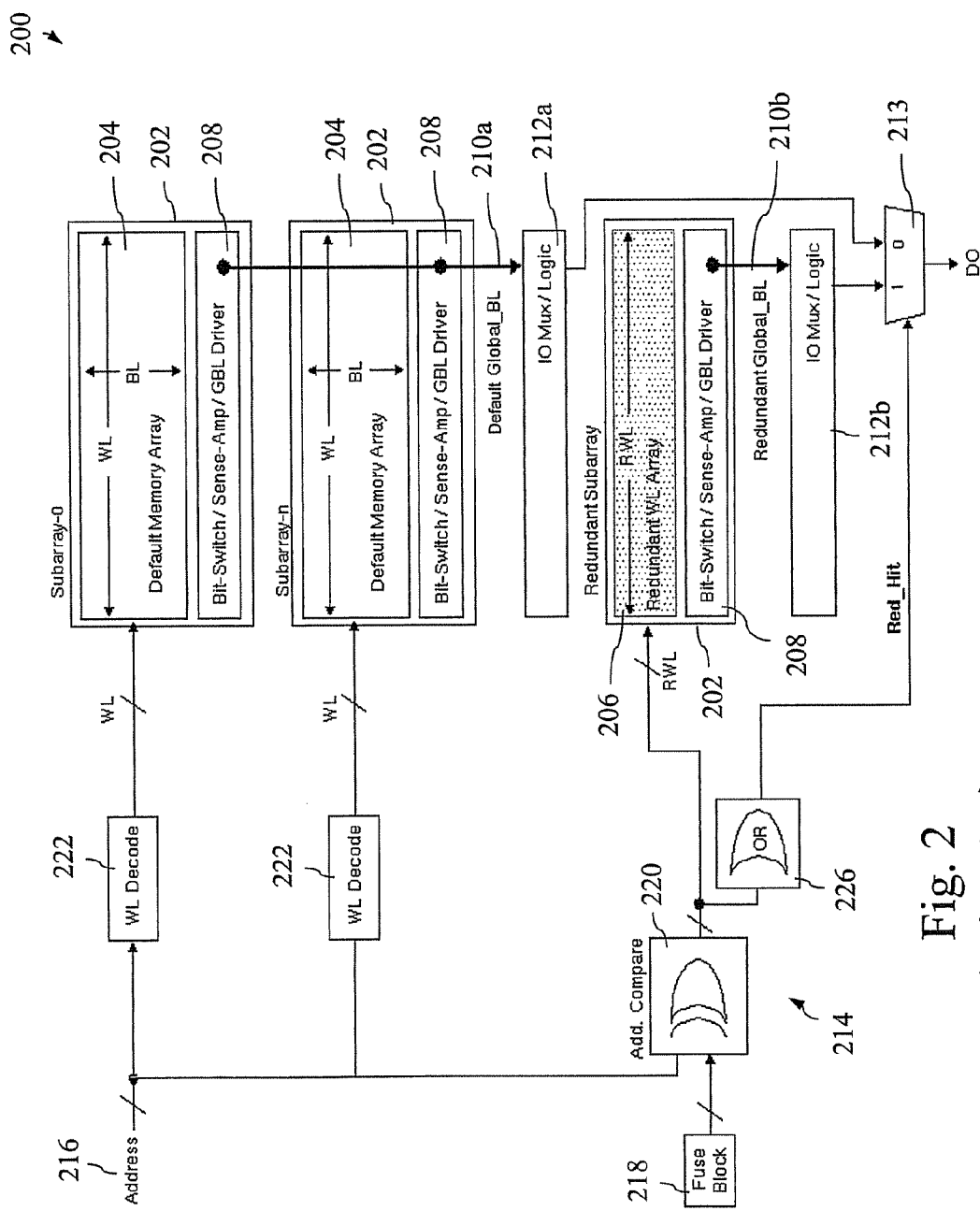
FIG. 2 is a schematic diagram of another conventional row redundancy system for memory devices.

In contrast, FIG. 2 is a schematic diagram of another conventional row redundancy system 200 for memory devices. As opposed to integrating word line redundancy directly into each subarray, the redundant word lines are formed as a separate subarray of the device. As more particularly shown in FIG. 2, the system 200 includes a plurality of memory subarrays 202, labeled as Subarrays 0 through n. In addition, one of the subarrays 202 is labeled "redundant subarray." The default subarrays each in turn include a default array 204 of word lines, bit lines and memory cells, as well as support circuitry 208 (e.g., bit-switch/sense amplifier/global bit line driver circuitry). Again, the default subarrays do not include any redundancy circuitry incorporated directly therein.

Similarly, the redundant subarray includes a redundant word line array 206 that can service any of the other default subarrays 0 through n. It will further be seen that the redundant subarray includes its own support circuitry therein, as is the case with the default subarrays. As a result, the plurality of subarrays 0 through n share a common default global bit line 210a, which feeds a first set of input/output multiplexing and control logic circuitry 212a. Because the redundant word lines are incorporated into a discrete subarray, the associated support circuitry 208 for the redundant subarray is coupled to a separate (redundant) global bit line 210b and a second set of input/output multiplexing and control logic circuitry 212b. Switching between data from the default global bit line 212a and the redundant global bit line 212b is implemented through the use of a multiplexing device 213.

In the redundancy approach of FIG. 2, it will be seen that the redundancy steering control circuitry 214 is effectively decoupled from the word line decode logic, in that activation of the word lines in the subarrays O-n according to the presented address 216 does not wait for the results of the address comparison performed by logic 214. Thus, there is no additional set up time penalty with respect to activating the word lines in the main or default array. In the event that the address compare circuitry (e.g., XOR logic 220 and OR logic 226) determines that there is a match between any of the stored data in the fuse block 218 and the presented address 216, then output signal Red_Hit (redundancy hit) is high, thereby causing multiplexing device 213 to output the data from the redundant global bit line 210b.

The timing of the development of the output signal Red_Hit is before the data access for either the main or redundant array, and only a very small access time penalty is incurred from the muxing operation. The access to the redundant subarray happens later in time (after completion of the address compare). Furthermore, the redundant subarray has smaller bit line parasitics and thus its access time is actually faster than the main array. As such, the overall access time for the redundant array (i.e., the address compare time added to the relatively fast redundant array access time) is comparable to the access time of the main array.

However, notwithstanding the improvements in both speed and repair efficiency as compared to the system of FIG. 1, the approach of FIG. 2 has its own drawbacks with respect to device area and power consumption. Because the discrete redundant subarray has its own support (bit-switch/sense amplifier/global bit line driver) circuitry 208 and its own input/output multiplexing and control logic circuitry 212b, such an architecture occupies more device real estate and consumes more power.

Figure 3:
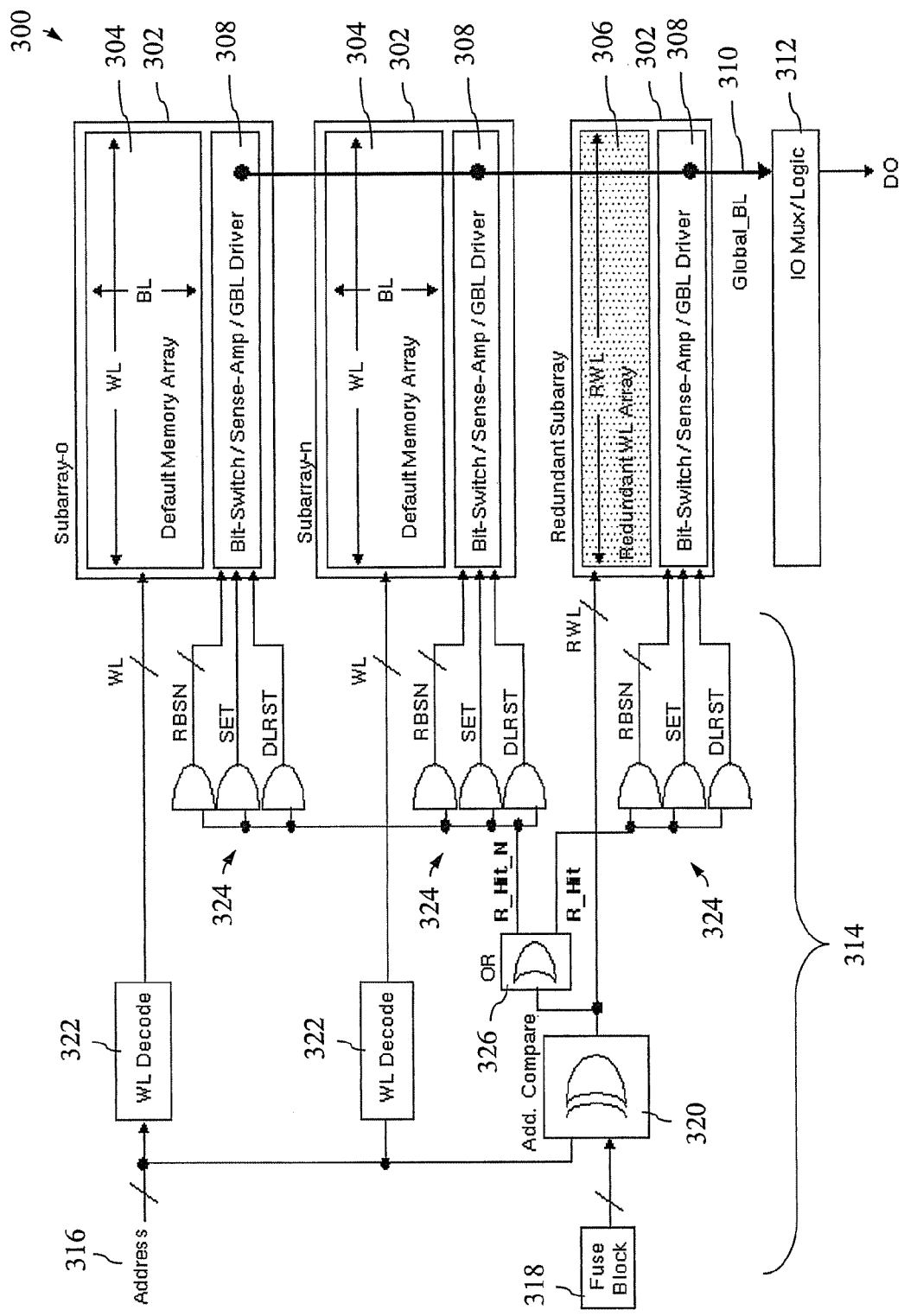
FIG. 3 is a schematic diagram of a row redundancy system for memory devices with reduced access time and reduced device area, in accordance with an embodiment of the invention.

Accordingly, FIG. 3 is a schematic diagram of a row redundancy system 300 for memory devices with reduced access time and reduced device area, in accordance with an embodiment of the invention. The system 300 includes a plurality of main (default) memory subarrays 302, labeled as Subarrays 0 through n. In addition, one of the subarrays 302 is labeled "redundant subarray." The redundant subarray is a fast redundant array bank structure added adjacent to the default array banks. This allows for better array lithography and better power routing for the redundant array.

The default subarrays each in turn include a default array 304 of word lines, bit lines and memory cells, as well as support circuitry 308 (e.g., bit-switch/sense amplifier/global bit line driver circuitry). Similar to the approach of FIG. 2, the default subarrays do not include any redundancy circuitry incorporated directly therein. However, as described in further detail below, system 300 (unlike system 200 of FIG. 2) avoids the additional device area penalty associated with FIG. 2 since there are no separation gaps or logic dividing the main and redundant subarrays. For example, all bussing structures (including data busses) can be shared between the main and redundant subarrays. This is reflected in FIG. 3, since both the main and redundant subarrays share a common global bit line bus 310 (Global_BL), and a single set of input/output multiplexing and control logic circuitry 312. As a result, there is a seamless partition between a subarray in the main array and the redundant subarray.

Because the exemplary embodiment of FIG. 3 eliminates the use of separate global bit line and input/output multiplexing and control logic circuitry associated with a discrete redundant subarray, a novel approach to word line redundancy steering control is thus also shown in FIG. 3. More specifically, the redundancy steering control circuitry 314 associated with system 300 utilizes gating of the address compare results. However, whereas the conventional approach of FIG. 1 incorporates gating into the word line decode/activation signal path (thus resulting in additional word line activation time penalties), the approach of FIG. 3 incorporates gating of the address compare results into the bit-switch/sense amplifier/global bit line driver circuitry 308 of the main and redundant subarrays 302, and in parallel with word line activation of the main and redundant subarrays.

During a read operation, the presented address 316 is decoded by the word line decode circuitry 322 associated with the main subarrays 0 through n. Again, the redundancy compare operations do not delay activation of the corresponding word line of each main subarray. Concurrently, the address 316 is compared with the programmed redundancy data in the fuse block 318, and a redundancy solution is calculated in the address compare circuitry (e.g., XOR logic 320 and OR logic 326). If a redundancy condition is determined, then an appropriate word line and the bit-switch circuitry in the redundant subarray are enabled. In addition, even though word line activation in the main subarrays is not gated off, the bit-switch selection and sense-amplifier devices 308 associated with the main subarray are gated off, through the use of gating logic (generally shown as 324 in FIG. 3). Conversely, if a redundancy condition is not determined based on the presented address 316, then the bit-switch/sense amplifier/global bit line driver circuitry of the main subarrays is enabled by the gating of logic 324, as described in further detail hereinafter. Correspondingly, the bit-switch/sense amplifier/global bit line driver circuitry of the redundant subarray is gated off. Complementary gating signals (R_Hit and R_Hit_N) are used to either pass or block, in an exemplary embodiment, each of three control signals: RBSN (read bit-switch), SET (sense amplifier set), and DLRST (data line restore).

Figure 4:
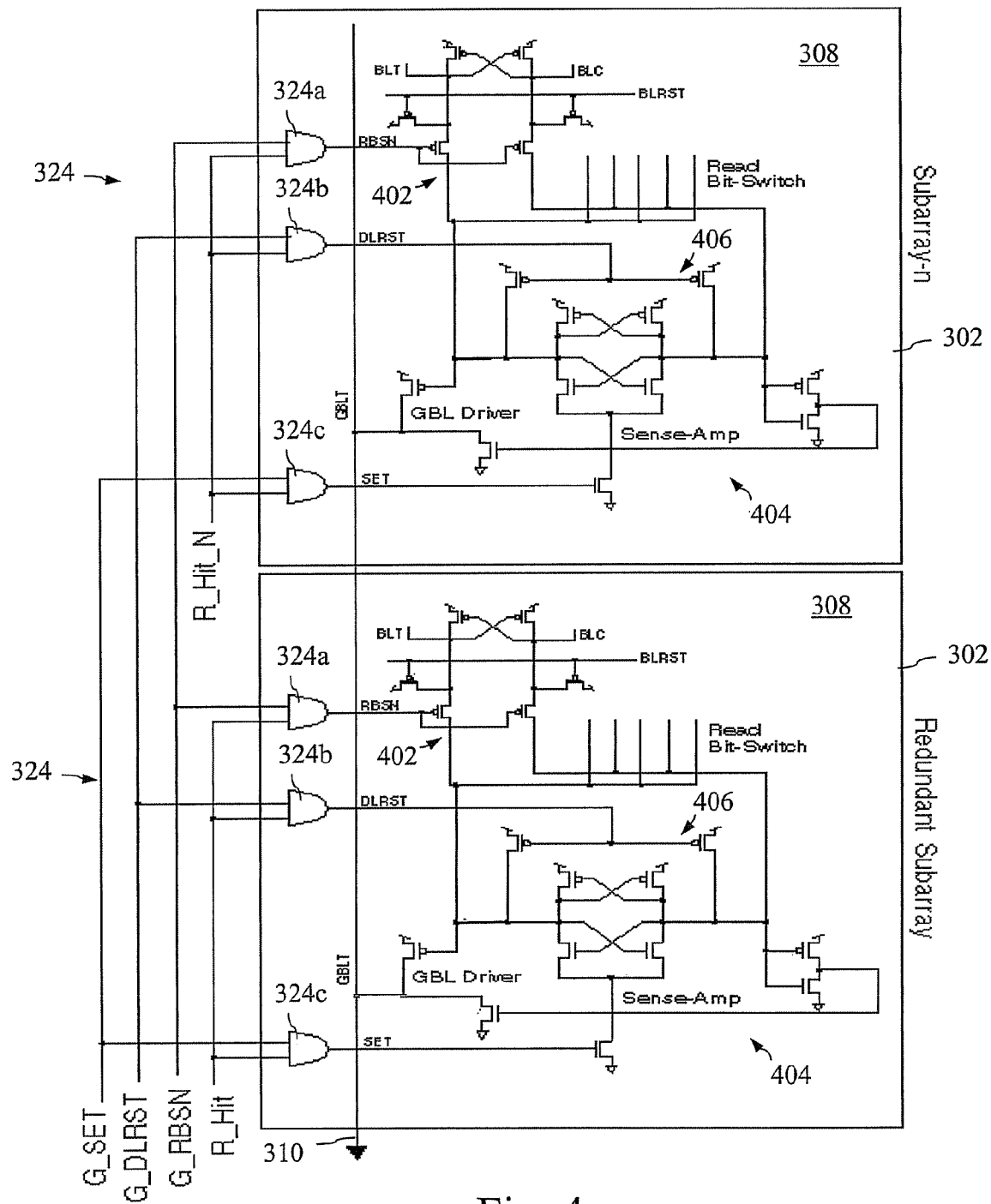
FIG. 4 is a schematic diagram which illustrates, in further detail, the operation of the gating logic with respect to the bit-switch/sense amplifier/global bit line driver circuitry of the main and redundant subarrays.

Referring now to FIG. 4, there is shown a schematic diagram which illustrates the operation of the gating logic 324 with respect to the bit-switch/sense amplifier/global bit line driver circuitry 308 of the main and redundant subarrays in further detail. With respect to the support circuitry 308, the exemplary embodiment gates three separate control signals as a prerequisite for transferring array data to the shared common global bit line 310. For each of the three control signals, a first redundancy signal R_Hit_N (no redundancy condition) is used for the main subarrays, while a second redundancy signal R_Hit (redundancy condition) is used for the redundant subarray. As indicated above, R_Hit_N is the logical complement of R_Hit.

For each subarray 302 (including main and redundant subarrays), a first AND gate 324a gates local control signal RBSN, which corresponds to read bit-switches in the support circuitry 308. In the illustrated embodiment, the read bit-switches are implemented as PFET devices 402, which selectively couple one of a group of bit lines of the subarray to a sense amplifier, generally indicated at 404. The global control signal (G_RBSN) for activating read bit-switches 402 is gated by R_Hit_N (no redundancy condition) in the case of the main subarrays, and by R_Hit (redundancy condition) in the case of the redundant subarray.

In addition to gating the read bit-switch control signals for each subarray, a second AND gate 324b is used to gate local control signal DLRST, which is used to deactivate a restoring (or precharging) of the sense amp data lines. When DLRST is low, PFET devices 406 precharge the data lines of the sense amplifier 404 to a logical high value. Thus, in order to capture array data into a sense amplifier, DLRST transitions to a high value to switch off PFETs 406 and allow a signal developed on the bit lines to be transferred to the data lines of the sense amplifier. Accordingly, the global data line restore signal (G_DLRST) is fed to the set of second AND gates 324b. Further, for each subarray, a third AND gate 324c is used to gate local control signal SET, which is used to couple the sense amplifier 404 to a low power supply rail (e.g., ground) and enable the data on the data lines to be latched into the sense amplifier itself. Thus, the global sense-amplifier set signal (G_SET) is fed to the set of third AND gates 324c.

Referring now to both FIG. 3 and FIG. 4, an exemplary operation of the support circuitry 308, in view of the redundancy steering control circuitry 314 disclosed herein, may be summarized as follows. During the access time for the main and redundant subarrays, a corresponding word line therein is activated such that bit line signal development initiates with the corresponding bit-switches 402 disabled. The redundancy calculation of steering control circuitry 314 occurs in parallel with the bit line signal development and, when completed, a logical high value is generated on either R_Hit (redundancy condition) or R_Hit_N (no redundancy condition). In either instance, this signal enables a "late" selection of the local read bit-switch (RBSN) signals of either the main subarrays or the redundant subarray, as well as a deselection of the appropriate data line restore (DLRST) local control signals. In turn, the signal developed on the bit lines of the subarray (due to uninhibited word line activation) is transferred to the data lines. The gated sense amplifier SET signal fires shortly after. Because the global bit line 310 is shared between main and redundant arrays, the signal SET is also gated with redundancy-enable information.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for implementing row redundancy in integrated circuit memory devices, comprising:
   one or more main subarrays having word line, bit line and memory cell devices, each of the one or more main subarrays including a set of support circuitry associated therewith;
   a discrete, redundant subarray associated with the one or more main subarrays, the redundant subarray also including a set of support circuitry associated therewith;
   a common global bit line shared by the one or more main subarrays and the redundant subarray; and
   redundancy steering control circuitry associated with the one or more main subarrays and the redundant subarray, wherein the redundancy steering control circuitry is configured such that word line activation of the one or more main subarrays and the redundant subarray is performed in parallel with address compare operations performed by the redundancy steering control circuitry, in that word line activation of the one or more main subarrays is not delayed by results of the address compare operations.

2. The system of claim 1, further comprising address compare logic configured to compare a presented address with stored data representative of one or more defective addresses within the main and redundant subarrays, wherein an output of the address compare logic is used to gate one or more control signals associated with the support circuitry of the main and redundant subarrays.

3. The system of claim 2, wherein the address compare logic is used to generate a first gating signal for the main subarrays and a second gating signal for the redundant subarray, the first gating signal being the logical complement of the second gating signal.

4. The system of claim 3, wherein the value of the first gating signal is high and the second gating signal is low whenever the address compare logic determines that the presented address does not correspond to a defective condition in any of the main subarrays, and wherein the value of the first gating signal is low and the second gating signal is high whenever the address compare logic determines that the presented address corresponds to a defective condition in at least one of the main subarrays.

5. The system of claim 2, wherein the one or more gated control signals associated with the support circuitry of the main and redundant subarrays further comprise a first control signal configured to activate one or more read bit-switch devices within the support circuitry.

6. The system of claim 5, wherein the one or more gated control signals associated with the support circuitry of the main and redundant subarrays further comprise a second control signal configured to deactivate precharging of a pair of data lines of a sense amplifier within the support circuitry.

7. The system of claim 6, wherein the one or more gated control signals associated with the support circuitry of the main and redundant subarrays further comprise a third control signal configured to couple the sense amplifier of the support circuitry to a power supply rail.

8. The system of claim 1, wherein the address compare operations are also performed in parallel with signal development on bit lines of the one or more main subarrays and the redundant subarray following the word line activation.

9. A method of implementing row redundancy in integrated circuit memory devices, comprising:
   activating, based upon a presented address, a word line within one or more main subarrays and a discrete, redundant subarray associated with the one or more main subarrays;
   the one or more main subarrays and the redundant subarray each having word line, bit line and memory cell devices, and a set of support circuitry associated therewith, wherein the one or more main subarrays and the redundant subarray share a common global bit line; and
   performing, in parallel with the word line activation, address compare operation using redundancy steering control circuitry, in that word line activation of the one or more main subarrays is not delayed by results of the address compare operations;
   wherein, depending upon the result of the address compare operations, data output on the common global bit line is from either the one or more main subarrays or the redundant subarray.

10. The method of claim 9, further comprising comparing the presented address with stored data representative of one or more defective addresses within the main and redundant subarrays and using an output of the comparison to gate one or more control signals associated with the support circuitry of the main and redundant subarrays.

11. The method of claim 10, further comprising generating a first gating signal for the main subarrays and a second gating signal for the redundant subarray, the first gating signal being the logical complement of the second gating signal.

12. The method of claim 11, wherein the value of the first gating signal is high and the second gating signal is low whenever the presented address does not correspond to a defective condition in any of the main subarrays, and wherein the value of the first gating signal is low and the second gating signal is high whenever the presented address corresponds to a defective condition in at least one of the main subarrays.

13. The method of claim 10, wherein the one or more gated control signals associated with the support circuitry of the main and redundant subarrays further comprise a first control signal configured to activate one or more read bit-switch devices within the support circuitry.

14. The method of claim 13, wherein the one or more gated control signals associated with the support circuitry of the main and redundant subarrays further comprise a second control signal configured to deactivate precharging of a pair of data lines of a sense amplifier within the support circuitry.

15. The method of claim 14, wherein the one or more gated control signals associated with the support circuitry of the main and redundant subarrays further comprise a third control signal configured to couple the sense amplifier of the support circuitry to a power supply rail.

16. The method of claim 9, further comprising performing the address compare operations in parallel with signal development on bit lines of the one or more main subarrays and the redundant subarray following the word line activation.

* * * * *